(12) United States Patent
Ghanta et al.

(10) Patent No.: US 6,212,655 B1
(45) Date of Patent: *Apr. 3, 2001

(54) IDDQ TEST SOLUTION FOR LARGE ASICS

(75) Inventors: Venkat C. Ghanta; Arun Gunda, both of Sunnyvale; Kaushik De, San Jose, all of CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/974,846

(22) Filed: Nov. 20, 1997

(51) Int. Cl.[7] ............................. G01R 31/28; G06F 11/00
(52) U.S. Cl. ........................................... 714/724; 714/741

(58) Field of Search ..................................... 714/724, 741, 714/739, 740, 738, 718, 719, 720

(56) References Cited

U.S. PATENT DOCUMENTS

| 5,390,193 | * | 2/1995 | Millman et al. | 371/27 |
| 5,410,548 | * | 4/1995 | Millman | 371/23 |
| 5,546,408 | * | 8/1996 | Keller | 371/37 |

* cited by examiner

*Primary Examiner*—Albert DeCady
*Assistant Examiner*—Samuel Lin

(57) ABSTRACT

A system and method identifies Iddq test vectors to be used in IDDQ testing of large CMOS circuits. This is achieved through intelligent preprocessing techniques. By monitoring only those nodes in the circuit that may be responsible for leakage current in the steady state, the size of the simulation results file is drastically reduced. The reduced simulation results file makes simulation a viable solution for IDDQ vector identification.

7 Claims, 7 Drawing Sheets

IDDQ TEST SOLUTION FOR LARGE ASICS

FIELD OF THE INVENTION

This invention relates to testing of integrated circuits for potential defects, and specifically to the identification of Iddq test vectors. These vectors produce minimal leakage currents in a defect-free circuit and, therefore, should reveal significant leakage currents in a defective circuit.

BACKGROUND OF THE INVENTION

While in steady-state operation, a defect-free CMOS circuit draws a minimal, but acceptable, amount of leakage current. In contrast, a defective CMOS chip produces a large quiescent current by virtue of a direct current path from the power supply to ground. The existence of such a path may lead to a reliability and performance degradation of the device. There are several methods, including current supply monitoring, for determining whether an integrated circuit is defect free.

The technique of monitoring supply current, commonly referred to as IDDQ or quiescent-current testing, has been established as an effective technique for assuring the quality and reliability of CMOS circuits. In an IDDQ test, a set of input vectors is applied to a chip in order to detect whether the circuit, in response to the stimuli, produces an unacceptably large quiescent current. Due to the size and complexity of many circuits, a small subset of all possible vectors is usually preselected for use in an IDDQ test. Simulation is one of the techniques used for preselecting a reduced set of test vectors.

In circuit simulation, using a conventional circuit simulator such as Verilog-XL or Quickhdl, a set of input vectors is applied to a model of the circuit under test. The steady-state response of each simulated circuit node is monitored and recorded. If in response to a simulated input vector, none of the simulated circuit nodes settle on a high-current state the vector is identified as a revealing test vector. This is because any quiescent current produced by an actual circuit in response to the identified test vector must be attributed to a circuit defect rather than to a high-current state. Simulated test vectors that yield high-current states are ignored, since they are not likely to distinguish an acceptable circuit from one that is defective.

As the size and complexity of CMOS circuits continue to increase, the size of the simulation results files follow suit. Also, the expense and time required to identify the subsets of test vectors using the above technique increases. Thus there is a need for a means to quickly and cheaply identify the smallest sets of test vectors that adequately test the circuits in question.

SUMMARY OF THE INVENTION

In accordance with an embodiment of the present invention, a method for selecting input vectors for testing integrated logic circuits uses a preprocessor, a simulator, and a vector identifier. The preprocessor identifies from a model of the circuit those nodes which have a greater-than-average chance of assuming a high-current state. The simulator applies a complete set of input vectors to the circuit model and records the responses of those nodes identified by the preprocessor. From the set of recorded nodal responses, the vector identifier identifies those input vectors that have produced no high-current states within the simulated circuit. These vectors are sent to a user or software application for use in testing actual circuits.

DETAILED DESCRIPTION OF THE INVENTION

In large defect-free application-specific integrated circuits (ASIC's), large levels of steady-state leakage currents, if any, are often traced to three relatively small sets of circuit nodes. By identifying the nodes of these three sets prior to circuit simulation, the time and effort required to identify valid test vectors is greatly reduced.

Figure 1A:
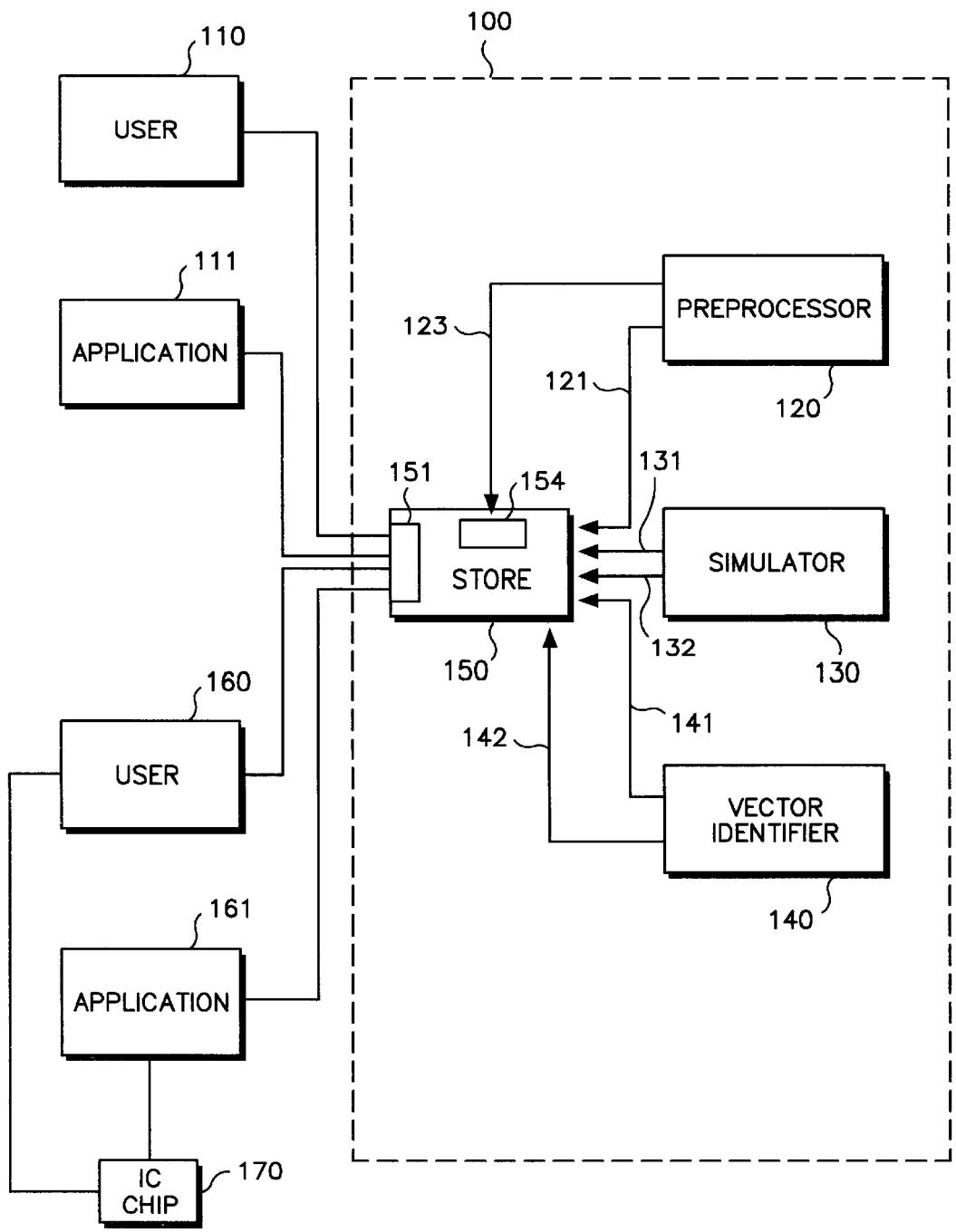
FIG. 1A is a block diagram illustrating one system in accordance with the present invention.

FIG. 1A is a block diagram of one system in accordance with the present invention. System 100 comprises a memory storage 150 and three software application blocks: preprocessor 120, simulator 130, and vector identifier 140.

Store 150 is a memory module that serves as a central storage for system 100 and comprises input 151 for receiving a netlist description of an integrated circuit from user 110 or application 111 and a technology library 154 that contains parameters describing the behavior of typical circuit elements and cells. The netlist is preferably defined by user 110 or application 111 in a hardware-description language such as, for example, Verilog or VHDL.

Preprocessor 120 identifies, in a circuit model created from the netlist, those nodes that could assume a high-current state with the proper stimuli. Preprocessor block 120 comprises pointer 121 for accessing the netlist in store 150, as well as pointer 123 for referencing technology library 154 as needed. Using the technology library, preprocessor 120 identifies three sets of possible high-current nodes in the circuit model. The first set comprises those nodes that are located within current-drawing cells, such as high-density memory devices and phase-lock loops. The second set comprises those nodes that are exposed to circuit input/output ports having pull-ups or pull-downs. Due to high or low voltage levels of external devices, these nodes may act as sources or sinks of acceptable currents into or out of the circuit. The third set comprises those nodes that could attain conflicting states by virtue of conflicting signals from multiple drivers and those nodes that could attain high-impedance states by virtue of tristate drivers. As preprocessor 120 locates nodes from these three sets, it assembles and stores the associated node identifiers in an IDDQ node dump file. At the completion of this task, the dump file thus assembled is stored in store 150.

Simulator 130 comprises a standard third-party simulator such as VerilogXL or Quickhdl and has pointer 131 for accessing the netlist and pointer 132 for referencing the IDDQ node dump file stored in store 150 by preprocessor 120. Conventionally, simulator 130 would be used to simulate the behavior of an integrated circuit by applying a complete set of input vectors and storing in a simulation results file the steady-state responses of each and every node throughout the simulated circuit. In the present embodiment, however, simulator 130 generates a reduced simulation results file by observing and storing only the responses in the circuit model of the high-current nodes which have been identified by preprocessor 120 and which are stored in the IDDQ node dump file. The reduced simulation results file is then stored in store 150 by simulator 130.

Vector identifier 140, which reviews the nodal responses contained in the reduced simulation results file, comprises pointer 141 for accessing the circuit netlist from store 150 and pointer 142 for referencing the IDDQ node dump file produced by simulator 130 and stored in store 150. Identifier 140 identifies and discards in the simulation results file those simulated input vectors that produce high-current states in any of the nodes of the model circuit. Such vectors cause some of the nodes to reside in a high-impedance or an intermediate-voltage state. Vector identifier saves in store 150 an IDD vector file that contains those simulated input vectors that do not yield high-current nodal states. Since the application of these vectors to a defect-free circuit should not produce leakage currents of any sort, they are particularly useful in identifying defective circuits which do. The IDD vector file is then read from store 150 by user 160 or software application 161 as needed for the testing of actual circuits.

Upon receiving the resulting IDD vector file, user 160 or application 161 tests a physical embodiment 170 of the circuit for leakage-current defects. Typically, testing is performed on a prototype or on a finished product during the manufacturing stage. In either case, testing is accomplished by reading from the IDD vector file those vectors to be applied to the circuit, applying the vectors, and monitoring any leakage currents. Since the identified vectors have been determined to be those that are least likely to produce an acceptable leakage current in a defect-free chip, those integrated circuits which do produce a significant leakage current are deemed to be defective.

Figure 1B:
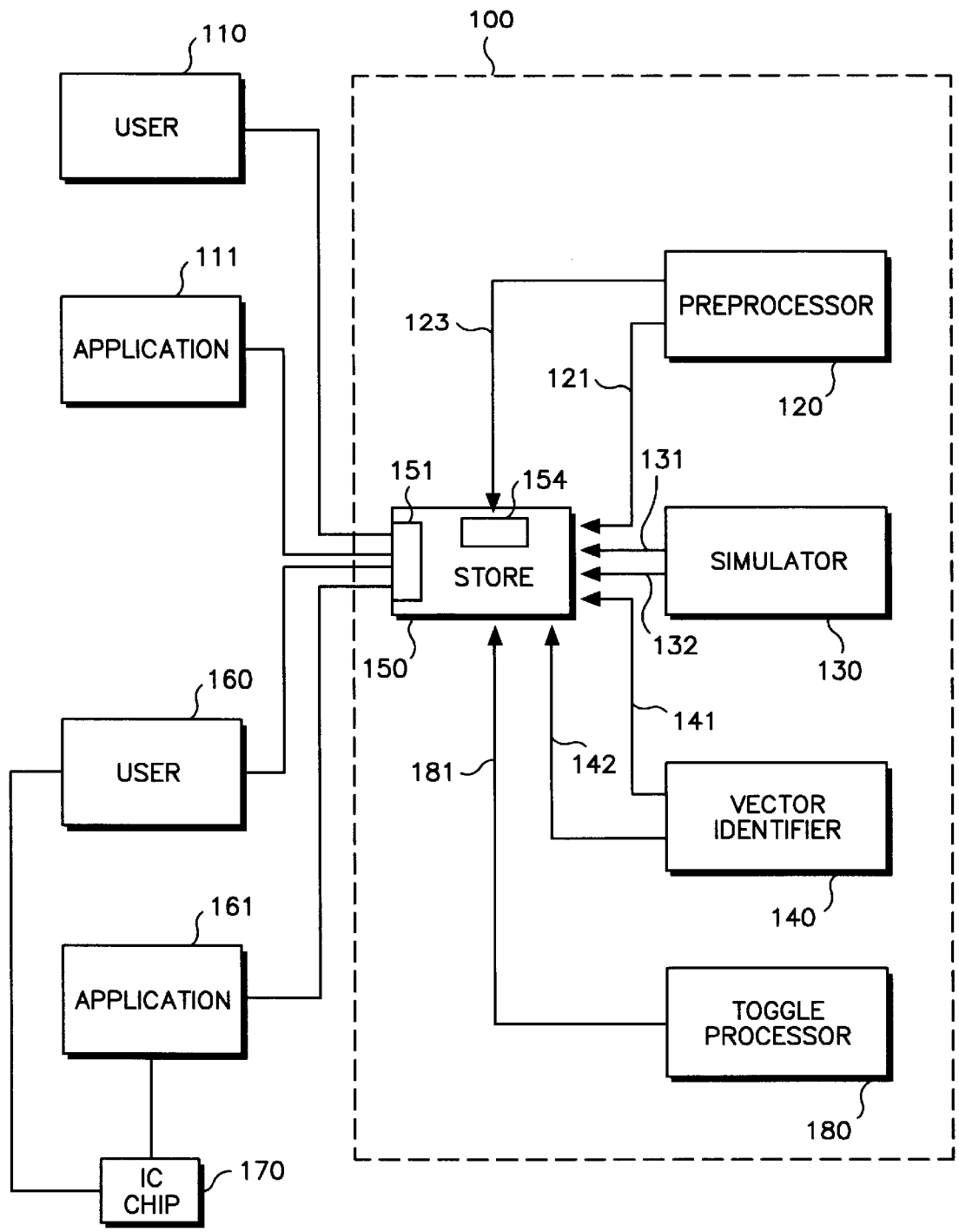
FIG. 1B is a block diagram illustrating another system in accordance with the present invention.

FIG. 1B is a block diagram of a second system in accordance with the present invention. In addition to the elements of system 100, system 101 includes toggle processor 180. Processor 180 is a software application block and comprises pointer 181 for accessing the IDD vector file generated by identifier 140. Processor 180 reads the vectors identified by identifier 140 and instructs simulator 130 to simulate the operation of the circuit for a second time. In contrast, however, to the initial simulation, which involved every vector and only a few nodes, simulator 130 applies only those vectors from the IDD vector file and observes the response of each and every node in the circuit. The responses of the nodes to the reduced set of input vectors are stored in a toggle simulation results file, which is stored in store 150 by simulator 130.

Once the toggle simulation results file has been generated, processor 180 performs a toggle computation. The simulated nodal responses to each input vector are paired with and compared to the nodal responses produced by each of the other input vectors. If in response to any pair of input vectors, the state of a node is changed from, for example, a logical "1" to a logical "0" or vice versa, the node has been toggled. Those vector sets that have achieved the greatest number of toggled nodes are especially valuable for testing actual circuits, since a node that has properly toggled has a greater chance of being defect-free than one that has not. Tnus, depending on the quality tolerance desired by the user, the size of the IDD vector file may be restricted to those sets of input vectors that toggle a threshold percentage of the circuit nodes. For example, it may be possible to toggle ninety-five percent of the nodes in a circuit with as few as twenty input vectors that have been assured to produce a leakage current only in the eventuality of a circuit defect.

Figure 2:
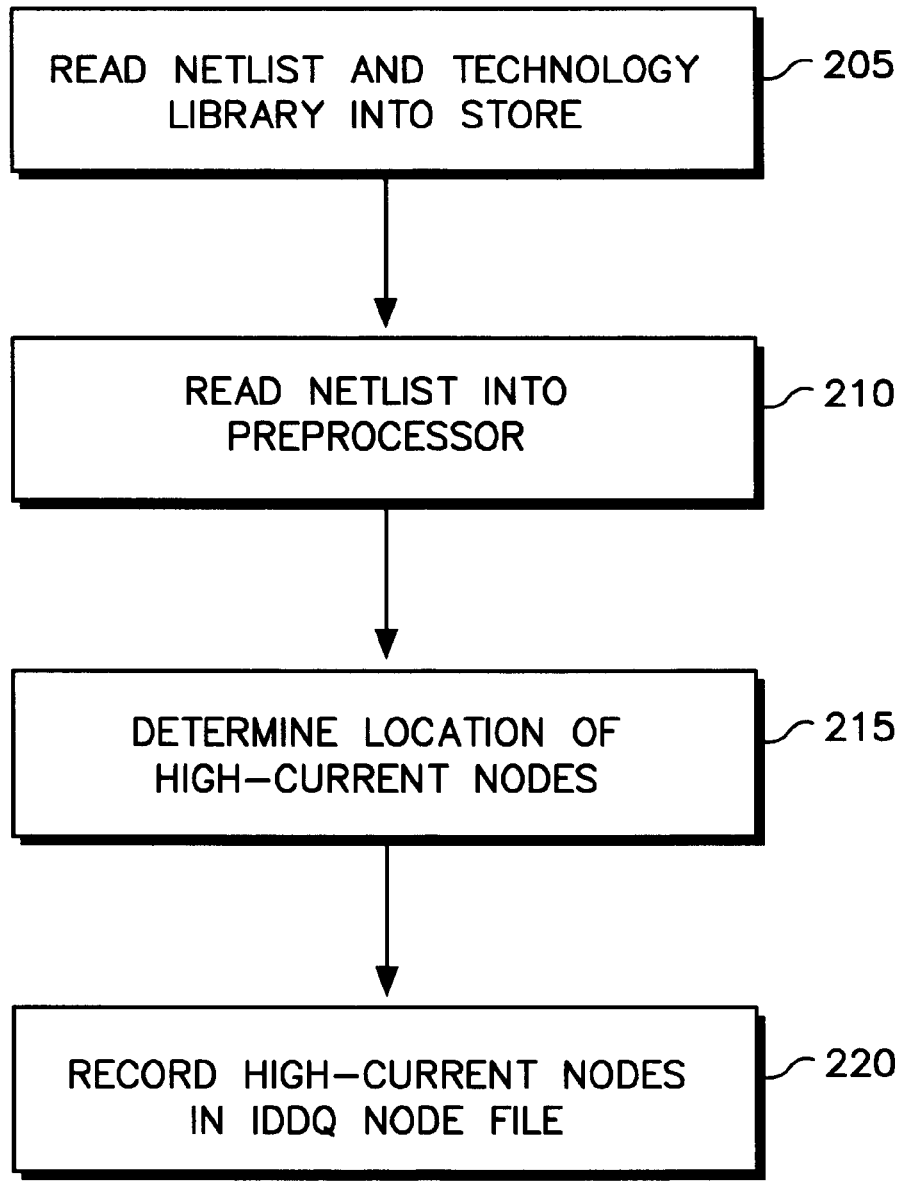
FIG. 2 is a flow chart illustrating a preprocessing method in accordance with the present invention.

FIG. 2 is a flow diagram 200 illustrating the preprocessing phase of a vector identification method in accordance with the present invention. Initially, an integrated circuit design netlist and the technology library are read 205 into store 150 from a user 110 or an application 111. Preferably, the netlist is defined in a conventional hardware-description language such as Verilog or VHDL. The netlist is read 210 by preprocessor 120, which uses technology library 154 to determine 215 the presence and location in the netlist of each node that may be placed in a high-current state. These nodes are typically associated with current drawing cells, input/output ports having pull-ups or pull-downs, or are driven by multiple or tristate drivers. Preprocessor 120 records 220 the identifiers of the corresponding nodes in the IDDQ node dump file located in store 150.

Figure 3:
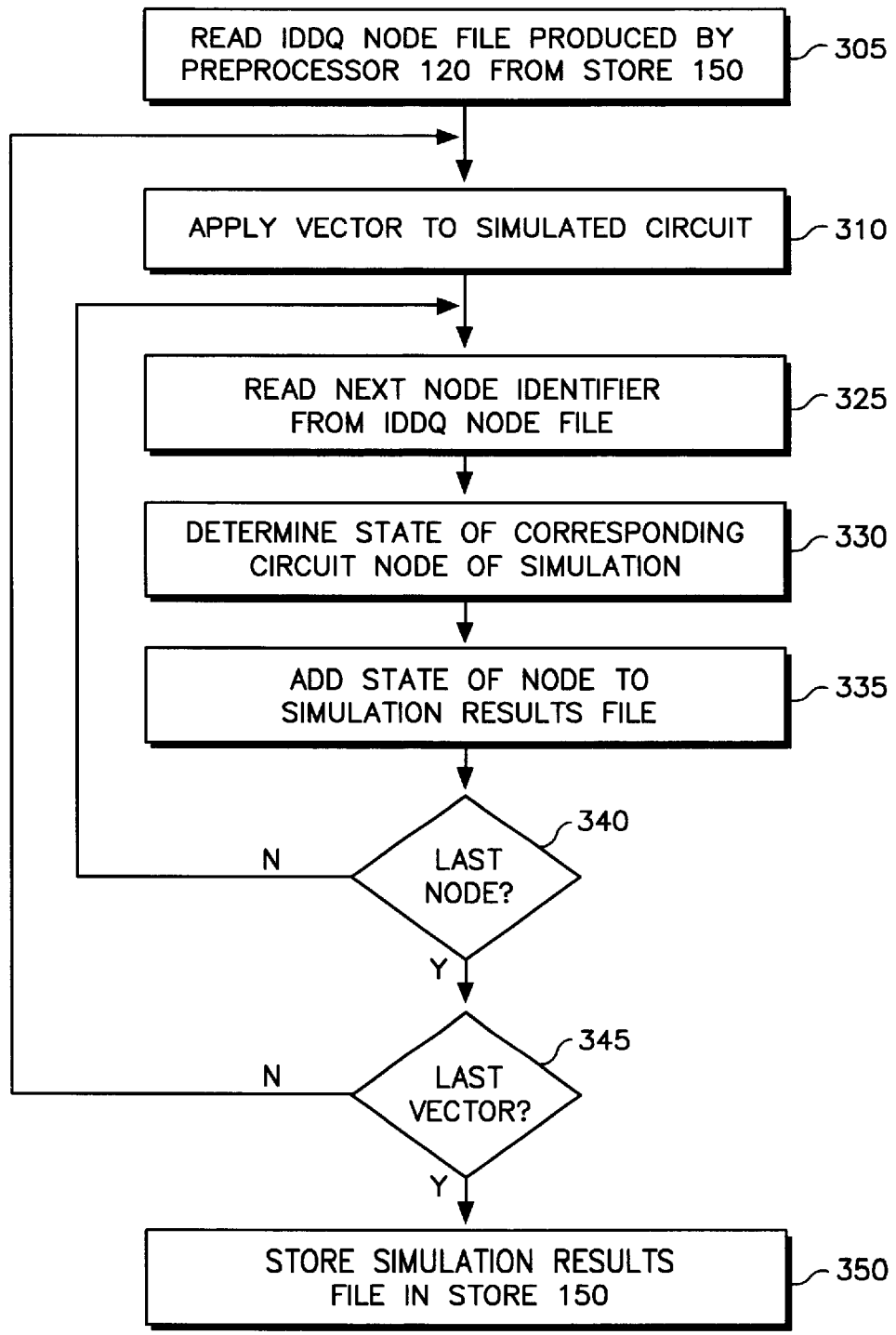
FIG. 3 is a flow chart illustrating a simulation method in accordance with the present invention.
Figure 4:
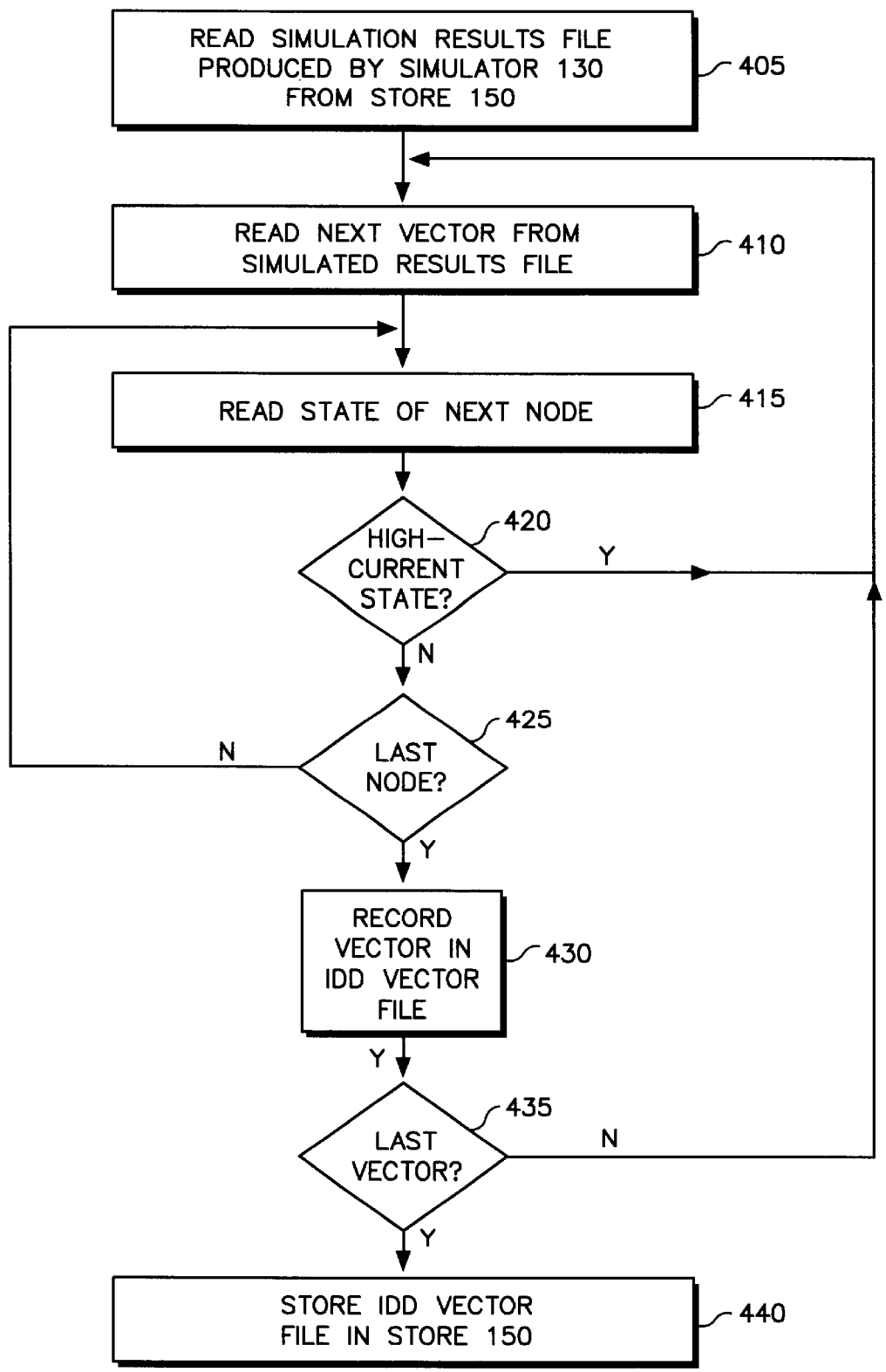
FIG. 4 is a flow chart illustrating a vector identification method in accordance with the present invention.

FIG. 3 shows a flow diagram 300 of the simulation phase of a vector identification method in accordance with the present invention. Specifically, simulator 130 reads 305 from store 150 the IDDQ node dump file generated by the preprocessor in steps 215 and 220. Simulator 130 then applies 310 the first simulated input vector, or the next simulated input vector in subsequent iterations, to the simulated circuit. Simulator 130 then determines in steps 310 and 330 the simulated steady-state response of each corresponding simulated circuit node in the IDDQ node dump file to the first simulated input vector. The response of each node in the simulation is then added 335 to a simulation results file which is located in store 150. Simulator 130 then determines 340 whether the last node indicated by the IDDQ node file has been observed. If not, the process loops back to step 325 and the analysis continues with the next node. If the last node has been observed, simulator 130 determines 345 whether the last input vector has been processed. If not, the next input vector is read from the vector file and steps 310 through 340 are repeated with the new input vector. Once the last input vector has been processed, the simulation results file is stored 350 in store 150 and the process continues as illustrated in FIG. 4, which is a flow diagram 400 of the process for identifying valid input vectors.

Specifically, vector identifier 140 reads 405 the simulation results file generated by simulator 130 in step 335. Identifier 140 reads 410 the first input vector recorded in the simulation results file. Identifier 140 reads 415 from the simulation results file the first steady-state node value associated with the retrieved input vector and then determines 420 whether the node value indicates a high-current state. If the node value is a high-current state, the associated input vector is discarded and the analysis resumes with the next vector in step 410. If the node value is not a high-current state, identifier 140 determines 425 whether the response of the last node to the input vector has been analyzed. If the last node has not been analyzed, the next node is read 415 from the simulation results file. If the last node has been processed, the vector is recorded 430 in the IDD vector file and identifier 140 determines 435 whether any vectors remain in the simulation results file. If one or more vectors remain, the next vector is retrieved 410 from the simulation results file. If no vectors remain, every vector and associated nodal response have been processed and the process terminates 440 by storing the IDD vector file in store 150 so that user 160 or application 161 may apply it to integrated circuit 170.

Figure 5A:
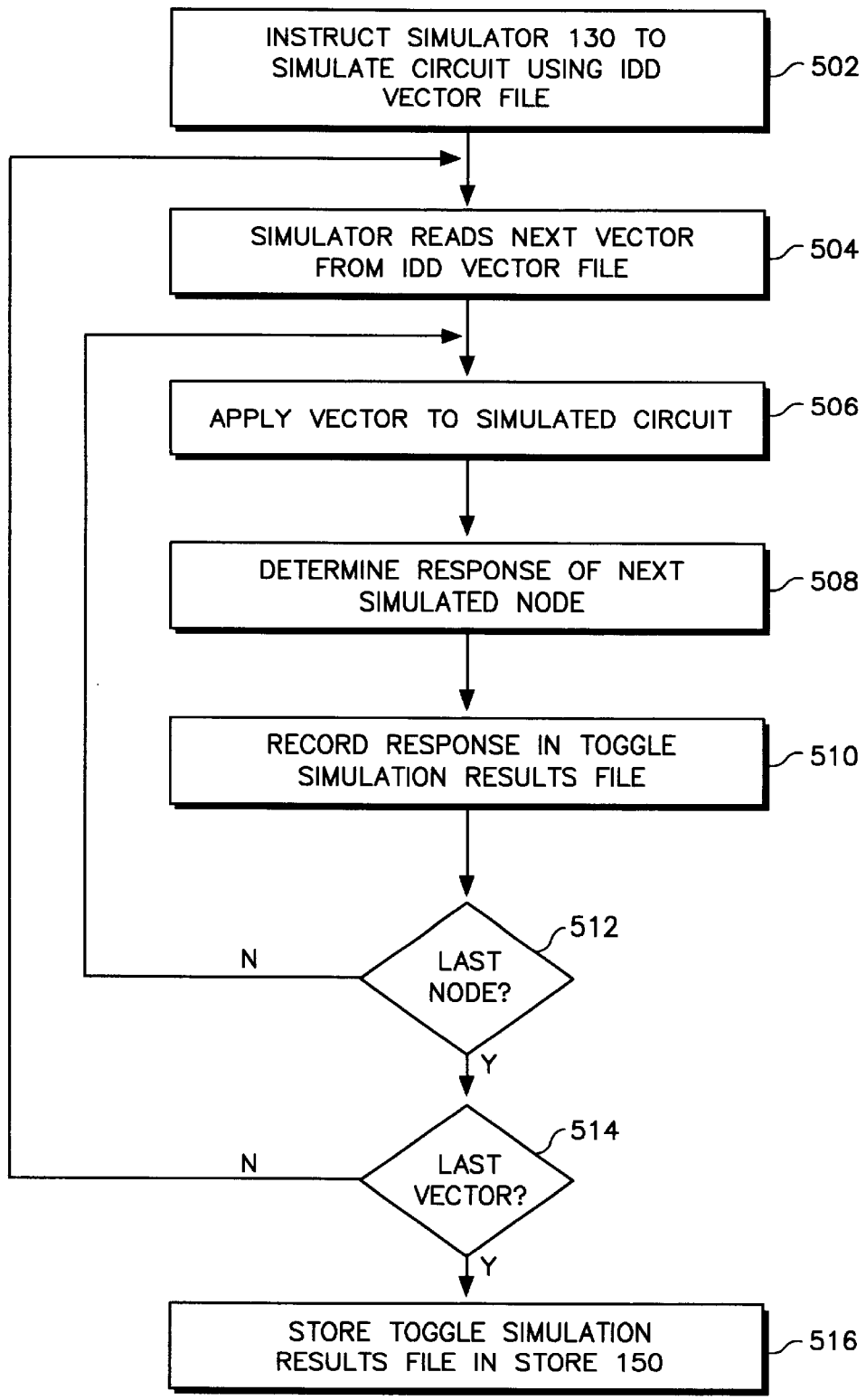
FIGS. 5A and 5B are flow charts illustrating a circuit stability and toggle-coverage determination method in accordance with the present invention.

FIG. 5A is a flow diagram 500 of the process for determining toggle coverage. Initially, toggle processor 180 instructs 502 simulator 130 to read the IDD vector file from memory and to apply the vectors from the file to the simulated circuit. It is noted that in contrast to the simulation described by FIG. 3 in which simulator 130 read input vectors from the full vector file, simulator 130 reads 504 the first vector stored in the IDD vector file. The first vector is applied 506 to the simulated circuit, and simulator 130 determines 508 the response of the first node in the simulated circuit to the input vector. In contrast to the first simulation in which only those nodes identified in the IDDQ node file were observed, the simulator now monitors each and every node in the simulated circuit. Specifically, the response of the node is recorded 510 in a toggle simulation results file, and simulator 130 determines 512 whether the last node in the simulated circuit has been analyzed for its response to the first input vector. If the last node has not been observed, the process returns to step 506, and steps 506 through 512 are repeated for the next node in the simulated circuit. If the last node has been analyzed, the simulator determines 514 whether the last vector in the toggle dump file has been applied to the simulated circuit. If the last vector has not been applied, the process returns to step 504, and steps 504 through 514 are repeated for the next vector. If the last vector has been applied, the processor stores 516 the toggle simulation results file in store 150 for computation of circuit stability and toggle coverage.

Figure 5B:
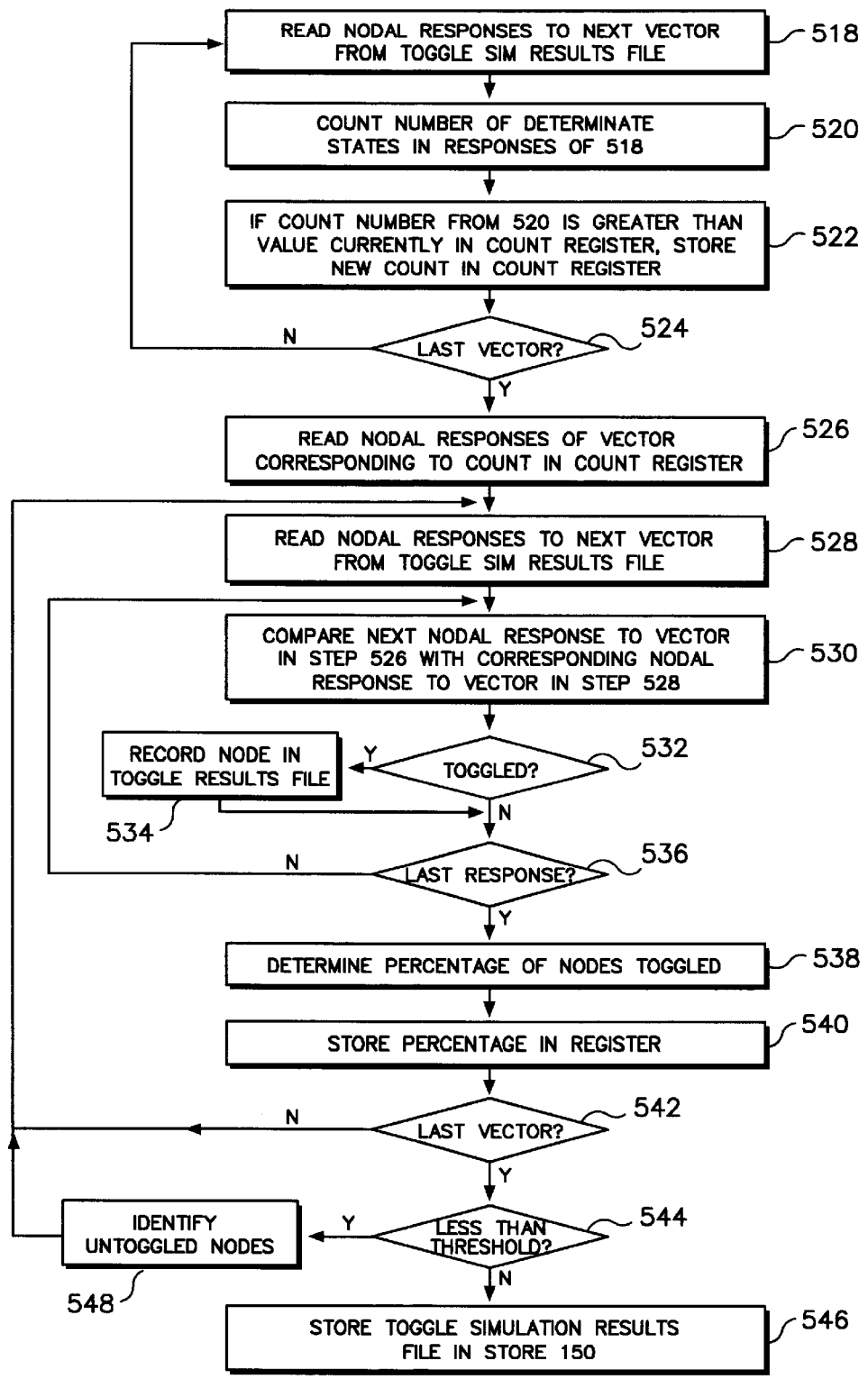

In step 518 of figure 5B, toggle processor 180 reads the nodal responses to the first vector from the toggle simulation results file. In step 520, the number of determinate ("1" or "0") nodal responses is counted and in step 522 stored in the count register. In step 524, it is determined whether the number of determinate nodal responses for each vector have been counted. If not, the process repeats with the next vector in step 518. If the number of determinate responses for the next vector exceed the current count stored in the count register, the greater and more recent count replaces the number stored in the register in step 520. Once the nodal responses to each vector have been processed, the count register should hold the highest count of determinate nodal responses generated by any one vector. This vector is the first vector selected for inclusion within the set of toggle vectors because the high number of determinate responses makes the determination of toggling vectors easier to locate and should ultimately result in a small set of toggle vectors. The nodal responses to this first vector are read in step 526.

In step 528, toggle processor 180 reads the nodal responses to a second input vector from the toggle simulation results file. In step 530, the nodal response of the first node to the vector selected in step 526 is compared with the nodal response of the first node to the vector selected in step 528, and in step 532, it is determined whether the node has been toggled. If they differ logically, such that one response is a "0" and the other is a "1", the node has been toggled by the two vectors. If the node is toggled, it is recorded 534 in a toggle results file as being toggled by the set of vectors. In step 536, it is determined whether the last pair of nodal responses have been compared. If not, the process repeats for the next pair in step 530. Once each toggled pair of nodal responses to the first two vectors have been recorded, the percentage of nodes toggled by the vectors is determined in step 538. This percentage is stored in a percentage register in step 540. In step 542, it is determined whether the nodal responses to the first vector have been compared with those to all of the other vectors. If not, the process repeats with the next vector in step 528. As new toggle percentages are calculated for the sets of responses, the greatest percentage should be stored in the percentage counter unless and until a greater percentage is determined. The vector that generates the greatest toggle percentage with the first vector is included as the second vector within the set of toggle vectors. In step 544, this percentage is compared with a preselected tolerance threshold. If the percentage of nodes toggled is equal to or greater than the required threshold, the process is completed and terminates in step 546 with the storage of the toggle results file in store 150.

If the toggle percentage is less than that required by the threshold, those nodes which have not been toggled by the first two vectors are identified in step 548. The process then continues in step 528 with the selection of a third vector and the corresponding set of nodal responses. In this iteration of the analysis, however, the determination of toggled nodes is restricted to those nodes left untoggled by the first two vectors. Thus, only the nodal responses to the third vector of the previously untoggled nodes are compared to the nodal responses of the first and second vectors in step 530. The process then continues with steps 532 through 544 as in the previous iterations. The number of iterations required to create a complete set of test vectors is dictated by the preselected threshold.

Once the percentage of the total number of toggled nodes equals or exceeds the preselected threshold, the process ends in step 546. The final toggle results file contains a set of input vectors that, when applied to an actual circuit to be tested, will toggle at least the threshold percentage of circuit nodes and will stimulate a leakage current in the eventuality of a circuit defect.

What is claimed is:

1. A method for selecting input vectors for testing a logic circuit for leakage current defects, comprising:

creating a model of the circuit;

identifying high-current nodes in the model;

applying a set of input vectors to the model;

identifying responses of the high-current nodes to the set of input vectors; and selecting test input vectors from the set of input vectors that do not correspond to high-current responses.

2. The method of claim 1, wherein the step of identifying high-current nodes further comprises identifying nodes which are associated with current drawing cells.

3. The method of claim 1, wherein the step of identifying high-current nodes further comprises identifying nodes which are associated with inputs or outputs of the circuit.

4. The method of claim 1, wherein the step of identifying high-current nodes further comprises identifying nodes which are driven by multiple drivers or tristate drivers.

5. A method for selecting input vectors for testing a logic circuit for leakage current defects comprising:

creating a model of the circuit;

identifying high-current nodes in the model;

applying a set of input vectors to the model;

identifying responses of the high-current nodes to the set of input vectors;

selecting test input vectors from the set of input vectors that do not correspond to high-current responses;

selecting a first test vector from the test input vectors;

applying the first test vector to the model;

recording the response of each node in the model to the first test vector;

applying each remaining test input vector to the model;

recording the response of each node in the model to each remaining test input vector;

comparing a first set of nodal responses to the first test vector with each set of nodal responses to each remaining test input vector;

determining a number of toggled responses for each remaining test input vector; and selecting a second test vector from the remaining test input vectors that has a highest number of toggled responses.

6. A method for selecting input vectors for testing a logic circuit for leakage current defects, comprising:

a store for storing a technology library and for receiving and storing a model of the circuit;

a preprocessor for reading the technology library and the model of the circuit and for determining high-current nodes in the circuit;

a simulator for applying a set of input vectors to the model of the circuit; and a vector identifier for determining non-high-current responses and selecting test input vectors from the set of input vectors that do not correspond to high-current responses.

7. The method of claim 6, further comprising a toggle processor for applying the test input vectors to the model of the circuit and for selecting a first test input vector a second test input vector that have a highest number of toggled responses.

* * * * *